(12) United States Patent
Brennan et al.

(10) Patent No.: US 7,110,554 B2
(45) Date of Patent: Sep. 19, 2006

(54) SUB-BAND ADAPTIVE SIGNAL PROCESSING IN AN OVERSAMPLED FILTERBANK

(75) Inventors: Robert L. Brennan, Kitchener (CA); King Tam, Waterloo (CA); Hamid Sheikhzadeh Nadjar, Waterloo (CA); Todd Schneider, Waterloo (CA); David Hermann, Guelph (CA)

(73) Assignee: AMI Semiconductor, Inc., Pocatello, ID (US)

( * ) Notice: Subject to any disclaimer, the term of this patent is extended or adjusted under 35 U.S.C. 154(b) by 434 days.

(21) Appl. No.: 10/214,057

(22) Filed: Aug. 7, 2002

(65) Prior Publication Data

US 2003/0108214 A1   Jun. 12, 2003

(30) Foreign Application Priority Data

Aug. 7, 2001   (CA) .................................. 2354808

(51) Int. Cl.
   *H04B 15/00* (2006.01)
   *A61F 11/06* (2006.01)
(52) U.S. Cl. .................. 381/94.7; 381/94.2; 381/94.1; 381/71.6
(58) Field of Classification Search .............. 381/94.7, 381/94.1, 94.2, 71.6
   See application file for complete search history.

(56) References Cited

U.S. PATENT DOCUMENTS

| | | | | |
|---|---|---|---|---|
| 5,136,577 A | * | 8/1992 | Amano et al. ............... | 370/289 |
| 5,329,587 A | | 7/1994 | Morgan et al. | |
| 5,544,080 A | * | 8/1996 | Kobayashi et al. ......... | 700/280 |
| 5,887,059 A | * | 3/1999 | Xie et al. ................ | 379/406.09 |
| 6,070,137 A | * | 5/2000 | Bloebaum et al. .......... | 704/227 |
| 6,487,295 B1 | * | 11/2002 | Lofgren et al. .......... | 381/71.12 |

OTHER PUBLICATIONS

Brennan, R. Schneider, T. A Flexible Filterbank Structure for Extensive Signal Manipulations in Digital Hearing Aids. Circuits and Systems, 1998. ISCAS '98. Proceedings of the 1998 IEEE International Symposium. vol. 6, May 3-Jun. 1998, pp. 569-572.*

Kellerman, W. Analysis and Design of Multirate Systems for Cancellation of Acoustical Echoes. Acoustics, Speech and Signal Processing, 1988. ICASSP-88,Apr. 11-14, 1998, pp. 2570-2573, vol. 5.*

Perez, Hector et al.; A New Subband Echo Canceler Structure; Article; Oct. 1990; pp. 1625-1631; vol. E73, No. 10; Transactions of the Institute of Electronics, and Communication Engineers of Japan; Tokyo, Japan.

Higa, Yoshito et al; An Over-Sampling Subband Adaptive Filter with the Optimal Real Filter Bank; Acoustics, Speech, and Signal Processing, 1997; Apr. 21, 1997; pp. 2309-2312; IEEE International Conference on Munich, Germany Apr. 21-24, 1997, Los Alamitos, CA, USA, IEEE Comput. Soc. USA.

\* cited by examiner

*Primary Examiner*—Vivian Chin
*Assistant Examiner*—Devona E. Faulk
(74) *Attorney, Agent, or Firm*—Gardner Groff Santos & Greenwald, PC

(57) ABSTRACT

An adaptive signal processing system for improving a quality of a signal. The system includes an analysis filterbank for transforming a primary information signal in time domain into oversampled sub-band primary signals in frequency domain and an analysis filterbank for transforming a reference signal in time domain into oversampled sub-band reference signals. Sub-band processing circuits process the signals output from the filterbanks to improve a quality of an output signal. A synthesis filterbank can combine the outputs of the sub-band processing circuits to generate the output signal.

20 Claims, 12 Drawing Sheets

SUB-BAND ADAPTIVE SIGNAL PROCESSING IN AN OVERSAMPLED FILTERBANK

CROSS-REFERENCE TO RELATED APPLICATION

This application claims priority to under 35 U.S.C. §119 to a Canadian Patent Application entitled, "Sub-band Adaptive Signal Processing in an Oversampled Filterbank," having Canadian Ser. No. 2,354,808, filed Aug. 7, 2001, which is entirely incorporated herein by reference.

FIELD OF THE INVENTION

The present invention relates to signal processing and more specifically to a method and a system for adaptive signal processing.

BACKGROUND OF THE INVENTION

A conventional approach in the signal processing applications listed above is to use a time domain approach, where a filterbank is not used, and a single adaptive filter acts on the entire frequency band of interest. This single time domain filter is typically required to be very long, especially when applied to acoustic echo cancellation. Computational requirements are a concern because longer filters require exponentially increasingly more processing power (i.e., doubling the filter length increases the processing requirements by more than two). A longer filter typically requires more iterations by its adaptive controlling algorithm to converge to its desired state. In the case of an adaptive noise cancellation algorithm, slow convergence hampers the ability of the system to quickly reduce noise upon activation and to track changes in the noise environment.

In summary, the problems with time domain adaptive signal processing are: 1) Long filters are required—cannot interleave the update of multiple filters. 2) Slower filter convergence due to longer filter length, 3) Performance problems in the presence of coloured noise, and 4) Inability to set varying algorithm parameters for individual frequency bands.

Solutions to problems in time domain adaptive signal processing arising from coloured noise and a long filter are limited. A long filter is often a requirement that is dictated by the particular application, and shortening it would degrade performance. In cases when it is allowable, white noise can be inserted into the signal path to allow the filter to adapt quicker.

Slow convergence is usually dealt with by choosing algorithm parameters that result in fast convergence while still guaranteeing filter stability. In the Least Mean Squares (LMS) algorithm this is done by increasing the step-size parameter (mu). However, this approach causes considerable distortion in the processed output signal due to the larger fluctuations of the adaptive filter resulting from a high mu value.

A method used to increase computational speed in time domain signal processing is to perform operations in the Fourier transform domain (see J. J. Shynk, "Frequency Domain and Multirate Adaptive Filtering", IEEE Signal Processing Magazine, vol. 9, no. 1, pp. 15–37 January 1992). A section of the signal is transformed, operated on, then undergoes an inverse transformation. Methods are well known for performing specific operations in the transform domain that directly correspond to linear convolution (a common operation) in the time domain, but require less processing time. The added requirement of having to calculate the Fourier transform and inverse Fourier transform is offset when the signal can be transformed in blocks that are sufficiently large.

SUMMARY OF THE INVENTION

The invention seeks, through the use of WOLA filterbanks and other components, to alleviate these and other problems found in prior art implementations. In doing so, cost-effective solutions are achieved. Each of the shortcomings of the earlier technologies is addressed in turn.

In accordance with an aspect of the present invention, there is provided an adaptive signal processing system for improving a quality of a signal, which includes: a first analysis filterbank for receiving a primary information signal in the time domain and transforming the primary information signal into a plurality of oversampled sub-band primary signals in the frequency domain; a second analysis filterbank for receiving a reference signal in the time domain and transforming the reference signal into a plurality of oversampled sub-band reference signals numerically equal to the number of primary signal sub-bands; a plurality of sub-band processing circuits for processing these signals to improve a quality of an output signal; and a synthesis filterbank for combining the outputs of the sub-band processing circuits to generate the output signal.

The oversampled WOLA filterbanks also address the problems with traditional FFT-based sub-band adaptive filtering schemes. WOLA filterbank processing is described in U.S. Pat. No. 6,236,73 for hearing aid applications. These problems include highly overlapped bands that provide poor isolation, and lengthy group delay.

In addition, oversampled WOLA filterbank processing also provides the following advantages for sub-band adaptive signal processing: 1) Programmable power versus group delay trade-off; adjustable oversampling, 2) Stereo analysis in a single WOLA, 3) Much greater range of gain adjustment in the bands, and 4) The use of complex gains.

An oversampled WOLA filterbank sub-band adaptive system can also be implemented on ultra low-power, miniature hardware using the system described in U.S. Pat. No. 6,240,192 (Schneider and Brennan).

Through the use of the oversampled WOLA filterbank, the single time domain filter can be replaced by a plurality of shorter filters, each acting in its own frequency sub-band. The oversampled WOLA filterbank and sub-band filters provide equal or greater signal processing capability compared to the time domain filter they replace—at a fraction of the processing power.

Utilising the oversampled WOLA filterbank results in faster convergence and improved overall effectiveness of the signal processing application.

Yet another benefit of sub-band adaptive signal processing in an oversampled filterbank is referred to as the "whitening" effect (see W. Kellermann. "Analysis and design of multirate systems for cancellation of acoustical echoes." Proceedings IEEE International Conference on Acoustics, Speech, and Signal Processing, pp. 2570–2573, New York, N.Y., USA, April 1988. A white signal has a flat spectrum; a coloured signal has a spectrum that significantly vanes with frequency. The WOLA filterbank decomposes coloured input signals into sub-band signals with spectra that are "whiter" than the wide-band signal. Due to oversampling, the whitening effect occurs in only part of the spectrum; however, this behaviour is predictable and uniform across all bands and can therefore be compensated for by emphasis filters (described hereafter). The commonly used least-mean-square (LMS) algorithm for adaptive signal processing performs best with white signals [Haykin, Simon. *Adaptive Filter Theory*. Prentice Hall, 1996]. Thus, the whitening effect provides a more ideally conditioned signal, improving system performance.

Yet another benefit of sub-band adaptive signal processing in an oversampled filterbank is the ability to set varying algorithm parameters for individual frequency bands. For example, a noise cancellation algorithm can have filters that are set up to converge at different rates for different sub-bands. In addition, the adaptive filters can have different lengths. The increased number of possible parameters allows the system to be more effectively tuned according to the requirements of the application.

In situations in which processing power is limited or must be conserved, the update of the adaptive filter groups can be interleaved. Thus, although an adaptive filter may be occasionally skipped in the update process but it will still be updated at periodic intervals. This is in contrast to the situation of a single time domain filter where the processing cannot be split across time periods in this way.

Although some solutions have utilised some degree of oversampling—less than two times—(see M. Sandrock, S. Schmitt. "Realization of an Adaptive Algorithm with Sub-band Filtering Approach for Acoustic Echo Cancellation in Telecommunication Applications". Proceedings of ICSPAT 2000), they do not provide the low group delay, flexibility in power versus group delay trade-off and excellent band isolation of oversampled WOLA based adaptive signal processing.

The following are some of the combined advantages of adaptive signal processing using oversampled WOLA filterbank compared to earlier techniques: 1) Very low group delay, 2) A flexible power versus group delay trade-off, 3) Highly isolated frequency bands, 4) Wide-ranging band gain adjustments, 5) Variable algorithm parameters in different sub-bands (filter length, convergence rate, etc; algorithm parameters can be optimally adjusted to meet computation as well as other performance constraints), 6) Faster convergence of adaptive filters, 7) Reduced computation time, 8) Improved performance in coloured noise, and 9) Ability to split computational load associated with updating adaptive filters across multiple time periods.

A further understanding of the other features, aspects, and advantages of the present invention will be realized by reference to the following description, appended claims, and accompanying drawings.

Brief Description of the Drawings

Embodiments of the invention will now be described with reference to the accompanying drawings, in which.

DETAILED DESCRIPTION OF THE PREFERRED EMBODIMENTS(S)

Figure 1:
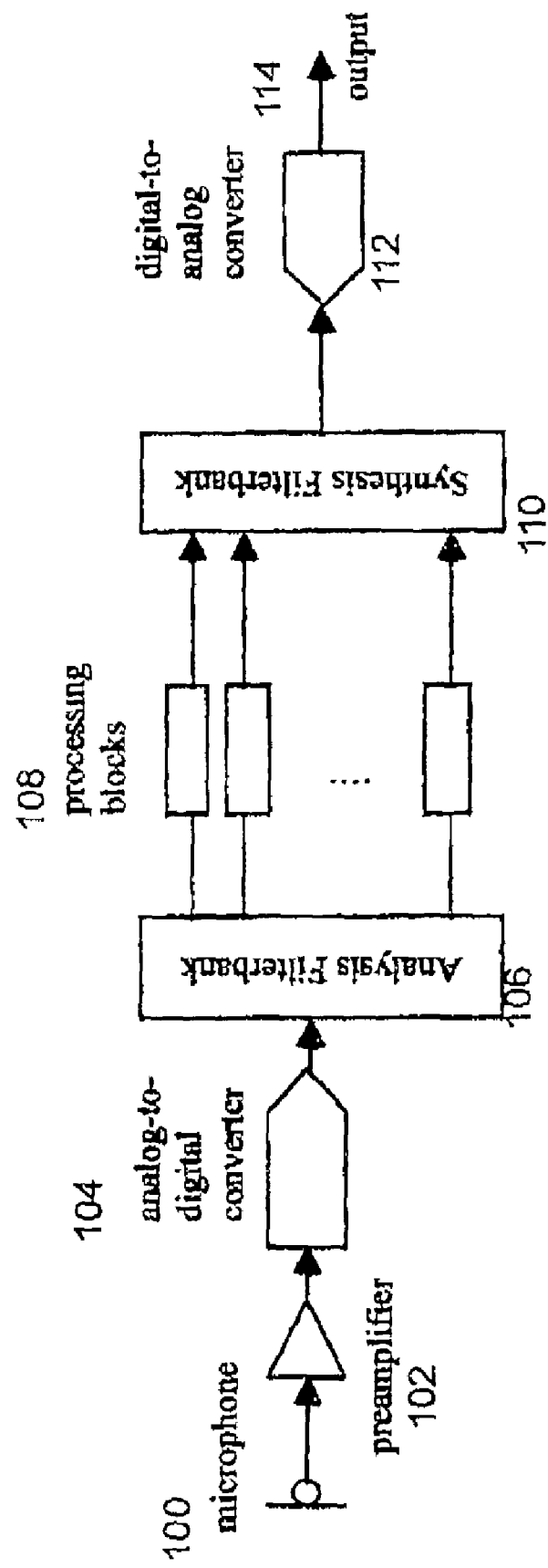
FIG. 1 shows a signal path through the oversampled WOLA filterbank operating in mono mode.
Figure 2:
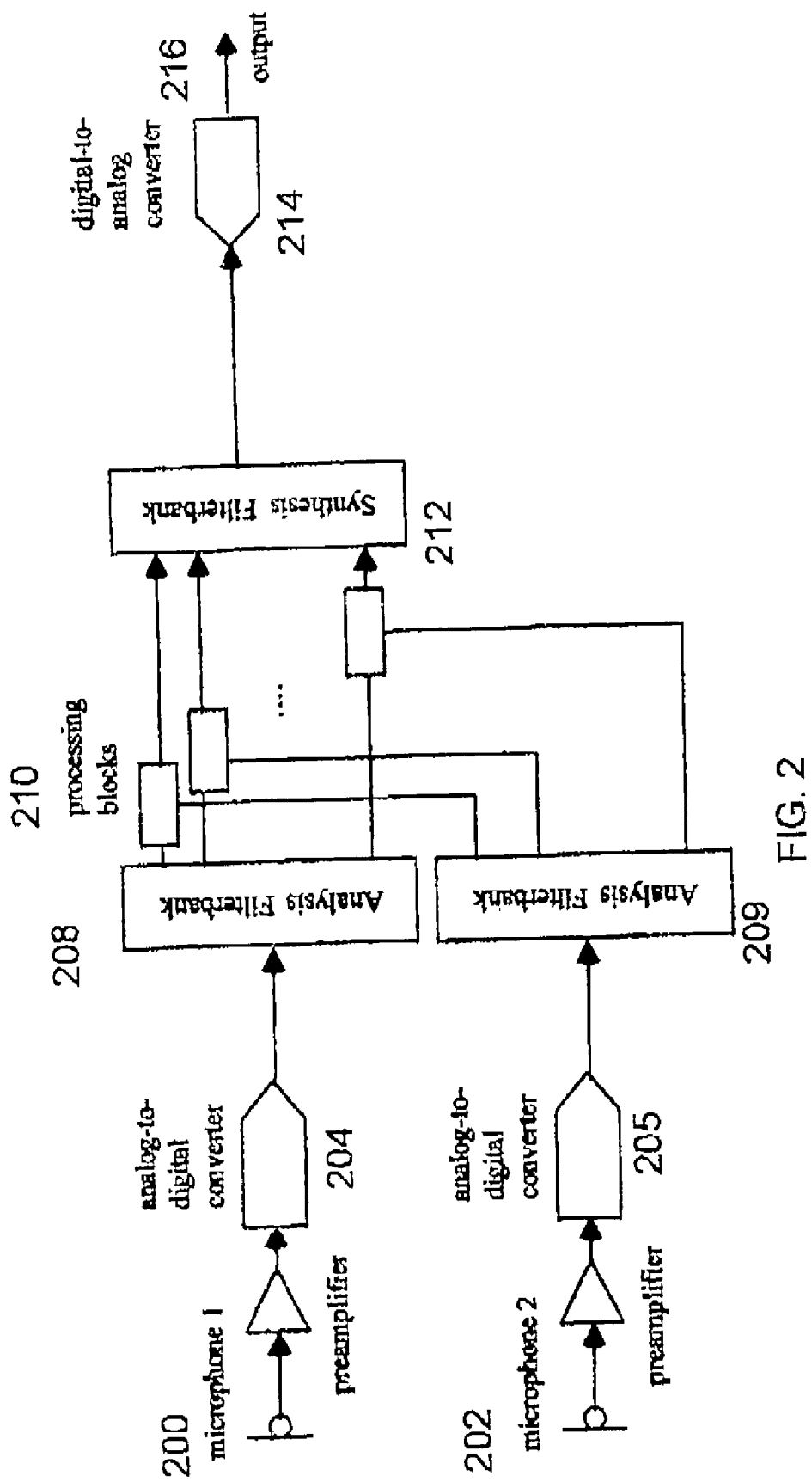
FIG. 2 shows a signal path through the oversampled WOLA filterbank operating in stereo mode.

FIG. 1 shows The signal path through a basic oversampled WOLA filterbank system operating in mono mode. The signal from the Microphone 100 passes through a preamplifier 102 to an analog to digital converter 104. The resultant digital signal output by the converter is passed into the analysis filterbank 106 that is programmed to divide the signal into sub-bands. Each sub-band is then passed to one of the Processing Blocks 108 whose outputs are combined by the Synthesis Filterbank 110 into a single digital signal that is passed in turn to a digital to analog converter 112 to produce an analog output 114. Similarly FIG. 2 shows the signal path through a basic oversampled WOLA filterbank system operating in 'stereo mode', although in this case the term is somewhat misleading, since although there are two inputs to the system, there is only one output. The signals from the two microphones 200, 202 each pass through respective preamplifiers 201, 203 to respective analog to digital converters 204, 206. The resultant digital signal outputs from the converters are passed into the analysis filterbank 208 that is programmed to divide each signal into a number of sub-bands. Each sub-band is then passed to one of the Processing Blocks 210 whose inputs are the equivalent sub-bands of both inputs, and whose outputs are combined by the Synthesis Filterbank 212 into a single digital signal that is passed in turn to a digital to analog converter 214 to produce an analog output 216. In both cases, the logic contained in the processing blocks is dependent on the particular application. For sub-band adaptive signal processing, these blocks contain adaptive filters and their associated control logic.

The type of filters (recursive or non-recursive), method of controlling the adaptive filters, and number of inputs (one or many) can vary. The LMS algorithm and its variants are widely used in adaptive signal processing for their relative simplicity and effectiveness. Many applications use the two-input stereo configuration, but sub-band adaptive signal processing with one or many inputs is also within the scope of this invention. Furthermore, this invention is not limited to any particular configuration of the oversampled WOLA filterbank (i.e., number of sub-bands, sampling rate, window length, etc).

The WOLA filterbank provides an input to each sub-band adaptive processing block that is highly isolated in frequency. The sub-band adaptive processing blocks may have independent adaptive parameters, or they may be grouped into larger frequency bands and share properties.

After adaptive processing, the modified sub-band signals are sent to the synthesis filterbank, where they are recombined into a single output signal. The net effect of the sub-band adaptive filters on this output signal is equal to a single time domain filter that is much longer than any one of the sub-band filters.

U.S. Pat. No. 6,236,731 "Filterbank Structure and Method for Filtering and Separating an Information Signal into Different Bands, Particularly for Audio Signal in Hearing Aids" by R. Brennan and T. Schneider, incorporated herein by reference, discloses the WOLA filterbank signal processing. A brief summary of that patent is included in an Appendix A attached hereto for convenience.

A description of two preferred embodiments of the present invention follows. Both described embodiments are for noise cancellation applications. This is a typical application of adaptive oversampled WOLA processing, but the present invention is not limited thereto. The first preferred embodiment is a sub-band noise cancellation algorithm that uses a variant of the LMS algorithm, and the oversampled WOLA filterbank in stereo mode. The second preferred embodiment also performs noise reduction with a two-microphone configuration and an alternative method for deriving the adaptive coefficients.

In a first preferred embodiment a sub-band noise cancellation system is described that uses a variant of the LMS algorithm together with an oversampled WOLA filterbank operating in stereo mode. Although least-mean squares signal processing is described here, other techniques well known in the art are also applicable. For example, recursive least squares can also be used.

The LMS algorithm is typically used to cancel the noise in transmitted speech when the speaker is located in a noisy environment. The listener, not the speaker, experiences the improvement in signal quality. Examples of where is algorithm can be used include telephone handsets, and boom-microphone headsets. This algorithm is useful for all headset styles that use two microphones for speech transmission. The algorithm can be applied to other applications as well. For example, one skilled in the art may modify this algorithm for acoustic echo cancellation or acoustic feedback cancellation.

Two-microphone adaptive noise cancellation works on the premise that one signal contains noise alone, and the other signal contains the desired signal (in this case speech) plus noise that is correlated with The noise in the first signal. The adaptive processing acts to remove the correlated elements of the two signals. Since the noise signals are (assumed to be) correlated and the speech is not, the noise is removed.

Figure 3:
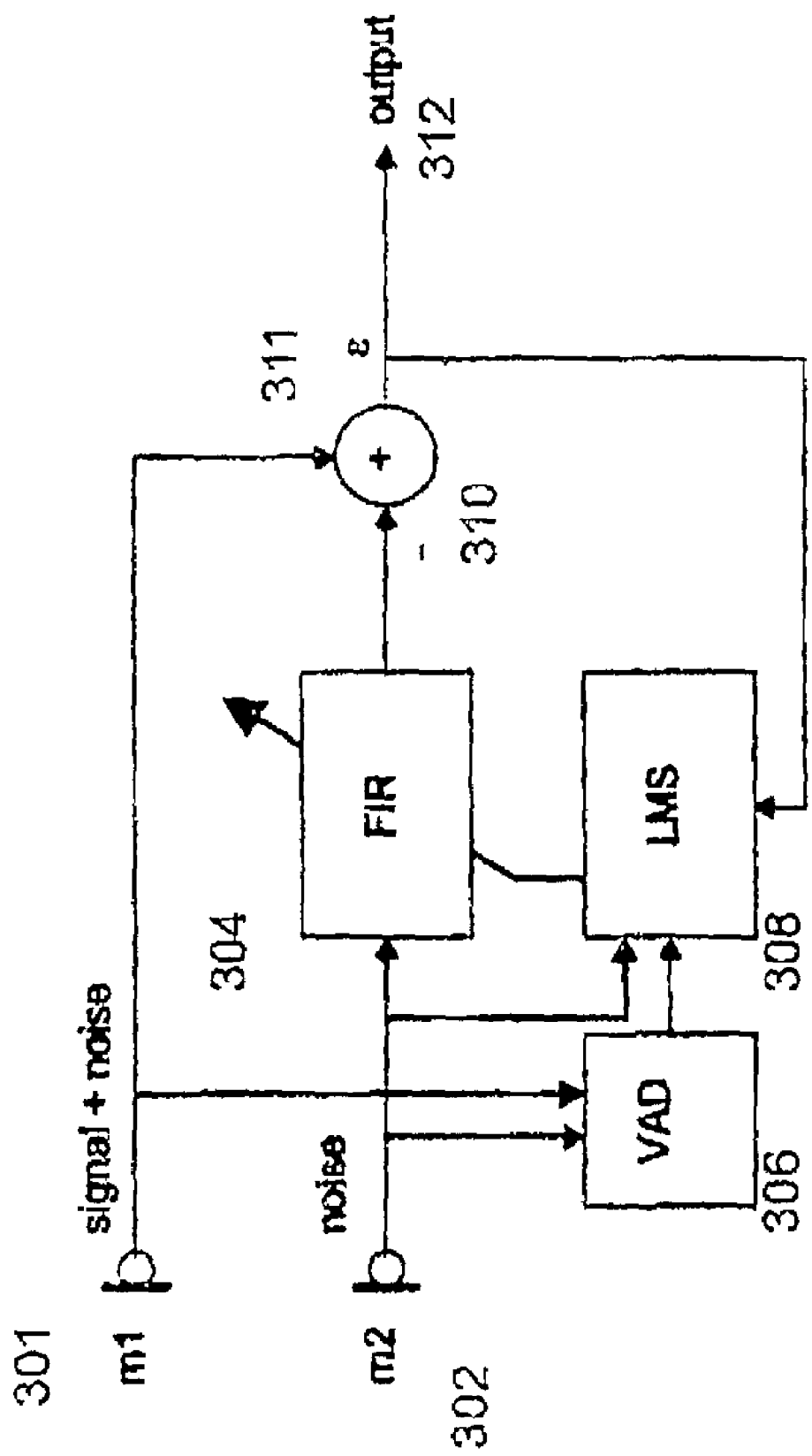
FIG. 3 shows a block diagram of a time-domain adaptive noise cancellation system.

FIG. 3 shows a block diagram of a time-domain, two-microphone adaptive noise cancellation system. A first microphone 301, which is arranged to pickup the wanted signal, passes its signal, which includes a noise component from the acoustical environment, to a Voice activity detector (VAD) 306 and a summer 310. A second microphone 302 which is arranged to pick up mainly the noise of the acoustical environment, passes its signal, which might include an attenuated version of the wanted signal, to the VAD 306, to an EMS processor 308, and to an adaptive Finite Impulse Response (FIR) filter 304. An LMS processor 308 uses the output from the VAD 306 as well as the output from the second microphone 302 to control the adaptive FIR filter 304 in order to minimize the noise appearing at the system output. The voice activity detector (VAD) 306 is used in some embodiments to stop or slow down adaptation when speech is present. This reduces obtrusive artefacts in the output signal 312 that are caused by misadjustments of the FIR filter due to the presence of speech. The VAD 306 typically uses both microphone signals 301, 302 as inputs and may employ the differential level as an indicator that speech is present, or it may use any one of a variety of more complex techniques. In a typical application, the microphone 301 faces the talker, and therefore will receive a higher level wanted signal that microphone 302 which is placed at some distance from the speakers mouth, but arrange to ensure a similar level of acoustical noise is received. For example, in a headset application, the two microphones could be located on a boom with the first microphone 301 facing in and the second microphone 302 facing out.

In a further embodiment, the algorithm is implemented in the frequency domain. FIG. 4a shows a block diagram of such a system. In this case, again, two microphones are used. A first microphone 401, which is arranged to pickup the wanted signal, passes its signal ('signal+noise'), which includes a noise component from the acoustical environment, to a Voice activity detector (VAD) 408 and to a first analysis filterbank 404. A second microphone 402 which is arranged to pick up mainly the noise of the acoustical environment, passes its signal ('noise-only'), which might include an attenuated version of the wanted signal, to the VAD 408, and to a second analysis filterbank 405. Each filterbank is arranged to provide an equal number of sub-bands derived from the incoming signals. These sub-band outputs are passed in turn to a like number of sub-band processing blocks 410, 412, 414, each of which uses a sub-band from the first analysis filterbank 404, as an input and the equivalent sub-band from the second analysis filterbank 405 as one adaptive or controlling input. Other controlling inputs are possible in farther preferred embodiments. Thus the processing of the signal is achieved in a number of sub-bands, each with a complex output signal (magnitude and phase), and each requiring much less processing than would be required for the whole band, the total processing being less than that required if the full band were to be processed at once. Again, the voice activity detector (VAD) 408 is used in some embodiments to stop or slow down adaptation when speech is present. Such a frequency domain implementation offers better performance than a time-domain implementation because it converges faster and, because of its sub-band operation, implements longer adaptive filters in an efficient manner. Interleaved or decimated updates are used in some embodiments to further reduce the computational load. Also, noise rejection for frequency-localized noise is likely to be improved.

Each of de sub-band processing blocks 410, 412, 414 implements what is well known in the art as the leaky normalized LMS algorithm. In a sub-band implementation of the leaky normalised LMS algorithm the LMS step-size can possibly vary in each sub-band; lower sub-bands contain high speech content and have a smaller step-size, while higher sub-bands can be more aggressively adapted with a larger step-size due to relatively low speech content. A typical sub-band processing block is shown in more detail in FIG. 4b. In the figure, the sub-band outputs of the two analysis filterbanks 404, 405 are shown. The 'signal+noise' component from filterbank 404 is passed directly to a summer 440. The 'noise-only' component from filterbank 405 is passed to both a FIR filter 430, and to an LMS filter 435. The output of the LMS filter 435 is used to adapt the response of the FIR filter 430. In some embodiments, a fraction of the output signal from the summer 440 is fed back and used as a further input to the LMS filter 435.

In a further preferred embodiment, the leaky normalised LMS algorithm is supplemented by a spectral emphasis filter. This additional filter is static and serves to whiten the LMS input signals for faster convergence. Oversampling in filterbanks such as those shown in the FIG. 4, 404, 405, inherently produces sub-band signals that are coloured in a predictable way. In the case of two times oversampling, the bottom half of the sub-band spectrum has relatively high energy and is relatively flat compared to the upper half of the spectrum, which contains very little energy. The spectral emphasis filters amplify the part of the spectrum known to have lower energy, thus the signal is modified towards the ideal case of being white.

Figure 5:
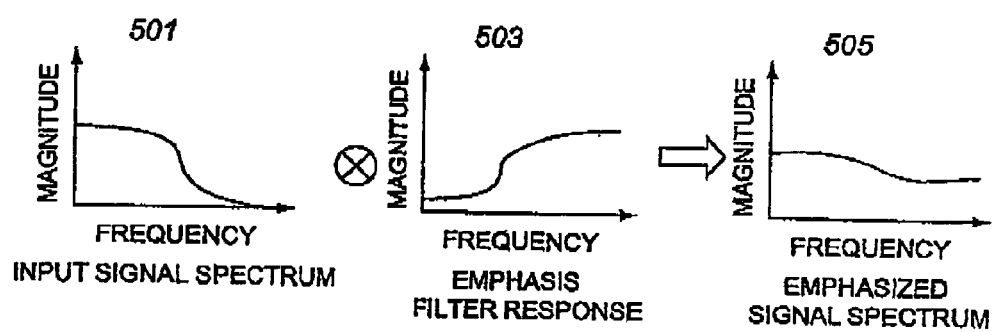
FIG. 5 is a schematic diagram showing a spectral emphasis operation.

FIG. 5 illustrates the effect of the spectral emphasis operation. The oversampled input signal shown in 501 has a drop off in energy towards high frequencies, and the emphasis filter response 503 is designed to amplify the high frequencies. The filtering operation results in a signal spectrum that is flatter 505, or a process known as 'whitening'.

Figure 4:
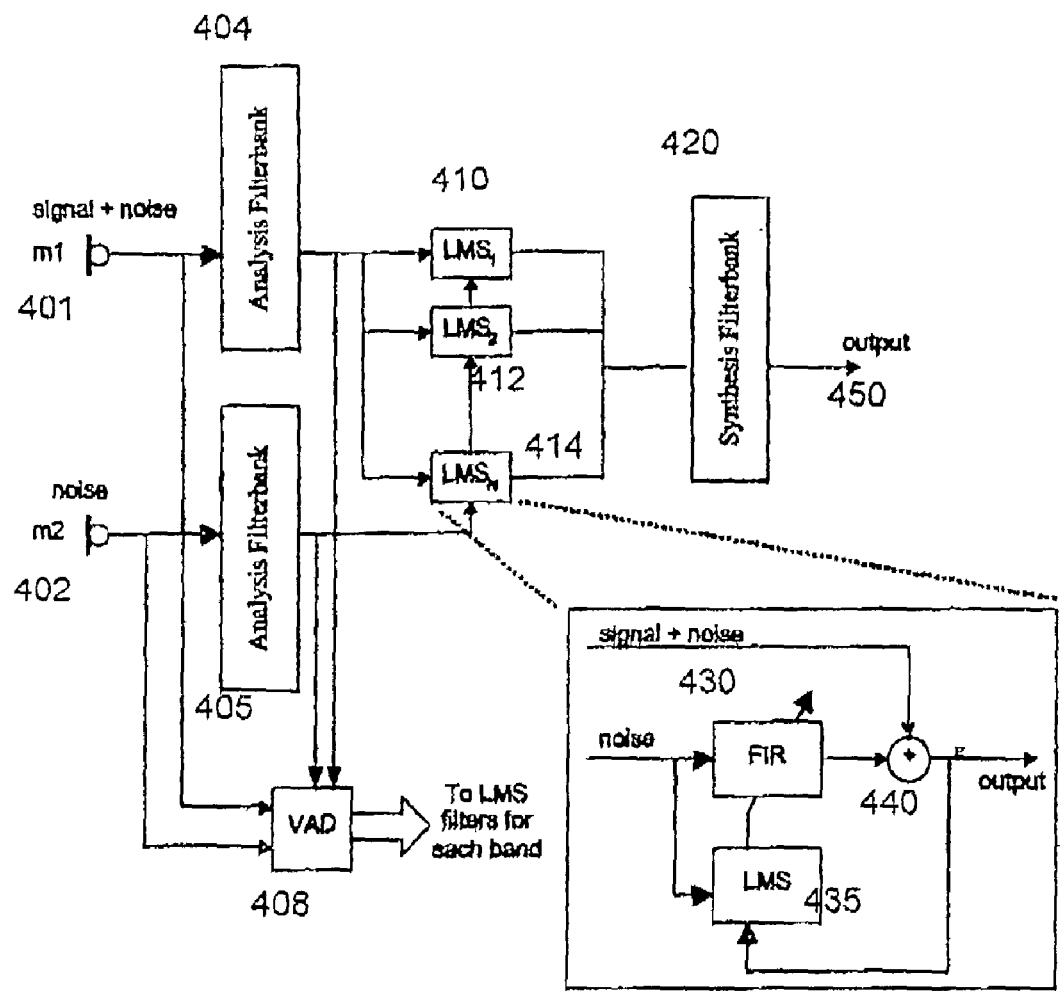
FIG. 4 shows a block diagram of a frequency-domain adaptive noise cancellation system.
Figure 6:
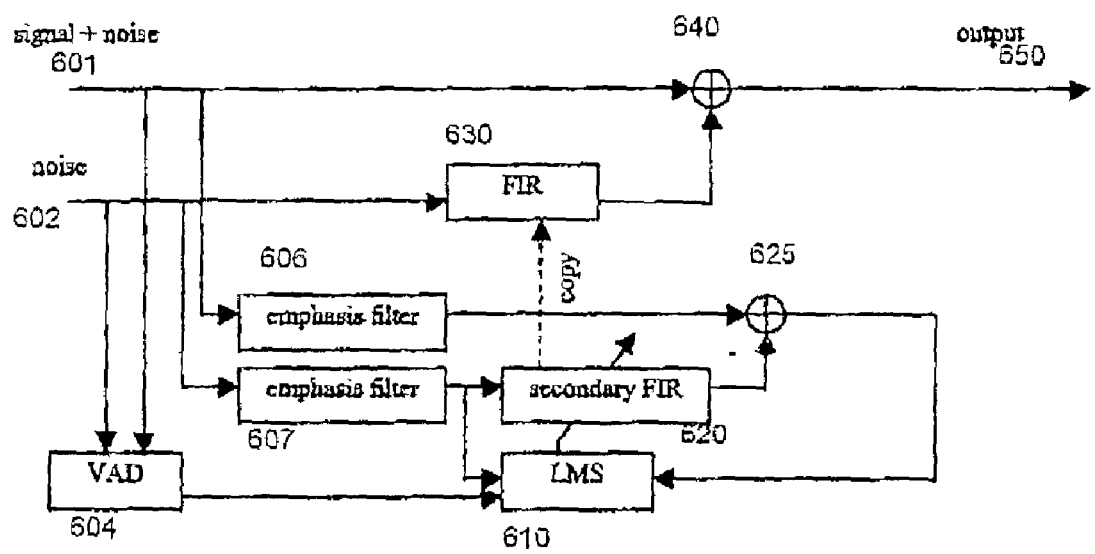
FIG. 6 shows the signal flow of the $LMS_N$ block when a spectral emphasis filter is used.

FIG. 6 shows the signal flow of a typical sub-band processing block of FIG. 4a, incorporating the spectral emphasis filter of FIG. 5. In this block, both the 'signal+noise' and the 'noise only' inputs are filtered and whitened by emphasis filters 606, 607 before they are used by the LMS block 610 to update a secondary Finite Impulse Response (FIR) filter 620. It is not desirable to have a synthesis filterbank output signal that has been noticably emphasized in some frequency regions, since the perceived signal is then somewhat distorted. To avoid this distortion, the coefficients that define the secondary filter 620 are copied to the FIR filter 630 used on the unemphasized noise signal 602 to generate the signal to be synthesized. The output of this FIR filter 630 is then summed 640 with the 'signal+noise' signal 601 to produce the output signal 650 which is later assembled by the synthesis filterbank 420 of FIG. 4 to produce the required audio signal.

The design of the emphasis filter is dependent on the oversampling factor used in the WOLA filterbank. Given the oversampled WOLA filterbank parameters, the spectral properties of the sub-band signals can be determined, and an appropriate emphasis filter can be designed. It can be implemented as a FIR filter or an infinite impulse response (IIR) filter.

Figure 7:
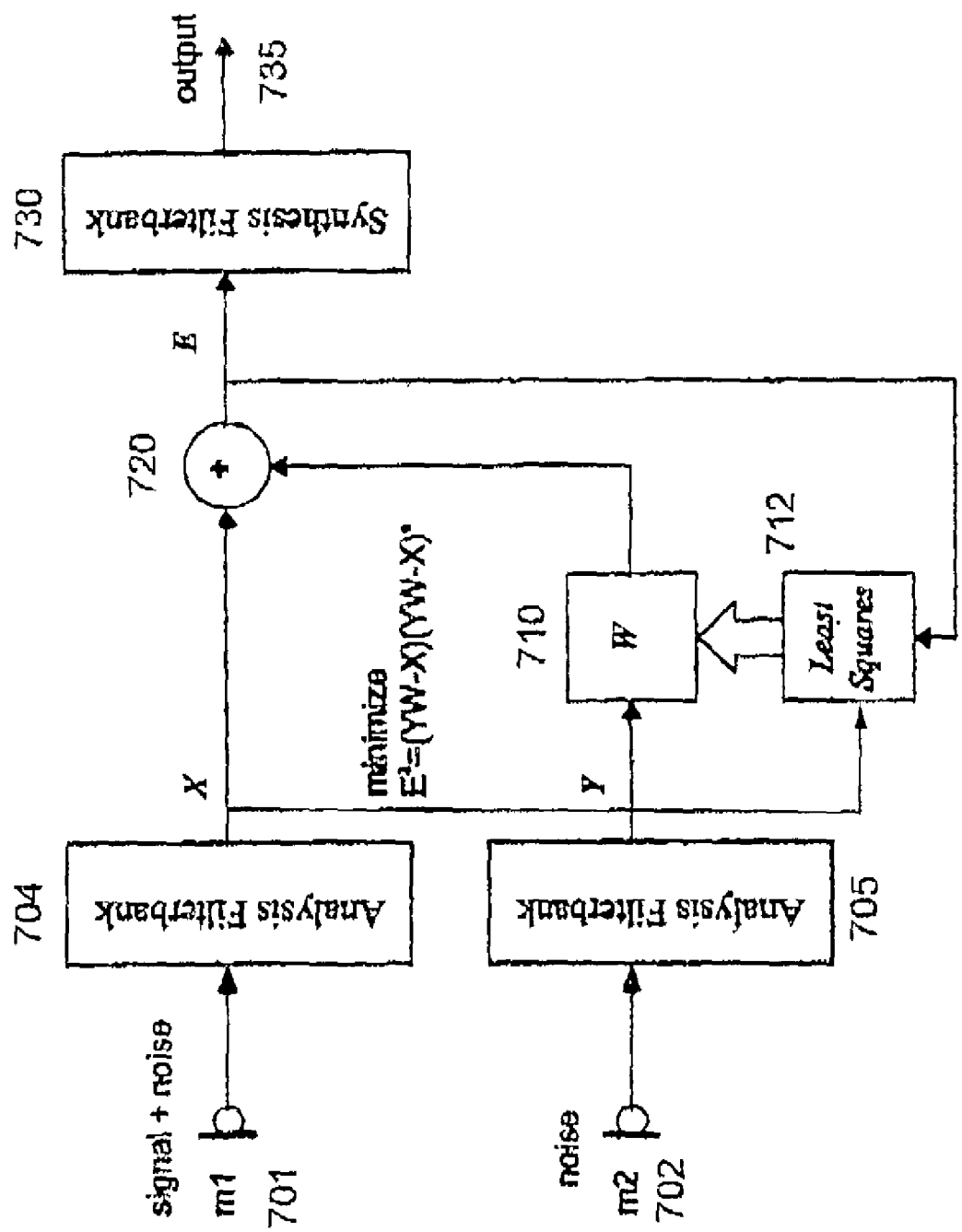
FIG. 7 shows a block diagram of a two-microphone Wiener noise cancellation system.

A further preferred embodiment of the invention is describe in the context of a transmit algorithm based on Wiener noise reduction technique which is well known in the art. Again this algorithm is useful for all headset styles that use two microphones for speech transmission. This embodiment uses the stereo processing mode of the WOLA filterbank. Two signals are simultaneously transformed to n sub-bands in the frequency domain: one is 'signal+noise', the other is 'noise only'. The processing acts to remove the noise that is correlated between the two signals. FIG. 7 shows a block diagram of this processing. Again, for convenience the action of the various components between the analysis filterbanks 704, 705 and synthesis filterbank 730 is described in terms of a single sub-band, although there will typically be a number of sub-bands. The outputs of the 'signal+noise' microphone 701 and the noise only microphone 702 are passed to two analysis filterbanks 704, 705 respectively. The sub-band outputs of the signal+noise filterbank 704 are each modified by a summer 720 before being assembled by the synthesis filterbank 730 to produce the required output 735. For each of the sub-bands of the 'signal+noise' signal, an equivalent sub-band of the 'noise only' signal is processed by filter W 710, controlled by a Least Squares block 712 whose inputs are the sub-bands from the 'signal+noise' filterbank 704 and a fraction of the appropriate summer result 720. The overall aim of the algorithm is to minimize $E^2$ in the expression:

$$E^2 = (YW-X)(YW-X)^*$$

Where E is the level of the sub-band input to the synthesis filterbank 730, X is the level of the signal+noise sub-band output by the analysis filterbank 704, Y is the level of the noise in the same sub-band output by the analysis filterbank 705, and W is the function of the filter block 710. The * operator denotes complex conjugation.

The algorithm is next discussed in some detail. The solution that minimizes $E^2$ is the equation:

$$W = r_{xy}/R_x, \tag{1}$$

where $R_x$ is the auto-correlation matrix of X and $r_{xy}$ is the cross-correlation matrix of X and Y (see M. H. Hayes. *Statistical Digital Signal Processing and Modeling*. John Wiley & Sons, Inc. 1996, pages 337–339).

If $R_x$ and $r_{xy}$ are estimated using only the most recent sample of X and Y, the value of adaptive weight $W_k$ at time index n is $$W_k(n) = Y_k(n)/X_k(n),$$

where k is the sub-band index.

Thus, update of an adaptive weight only requires division of the complex values $Y_k(n)$ and $X_k(n)$. Taking one-sample estimates of the auto-correlation and cross-correlation matrices eliminates the need to perform the matrix inversion of $R_x$ equation (1).

A novel addition to this algorithm is the use of frequency constraints. If left unconstrained, adjacent bands may have very different gains. While this will result in the lowest noise level (since $E^2$ will be minimized), it may also result in some undesirable processing artifacts giving rise to a lessening in perceived quality of the signal. Constraining the adjustment of the gain vector (W) results in less noise reduction, but fewer artifacts. Equation (2) defines a scheme where the gain in a given band is constrained by the two adjacent bands. Note that this case uses only a single (complex) weight per band. It is possible to extend this scheme to allow for multiple weights per band. For the single gain case, the matrix is block-diagonal; thus, there are efficient solution methods.

$$\begin{bmatrix} Y_1 & Y_2 & 0 & \cdots \\ Y_1 & Y_2 & Y_3 & 0 \\ 0 & Y_2 & Y_3 & Y_4 \\ 0 & 0 & \cdots & \end{bmatrix} \begin{bmatrix} W_1 \\ W_2 \\ \\ W_x \end{bmatrix} = \begin{bmatrix} X_1 \\ X_2 \\ \\ X_\lambda \end{bmatrix} \tag{2}$$

Multi-microphone Wiener algorithms like this have been successfully used for noise reduction in other applications; for example, see *Multi-Channel Spectral Enhancement In a Car Environment Using Wiener Filtering and Spectral Subtraction*, Meyer and Simmer, Proc.ICASSP-97, Vol. 2, pp. 1167–1170.

Figure 8:
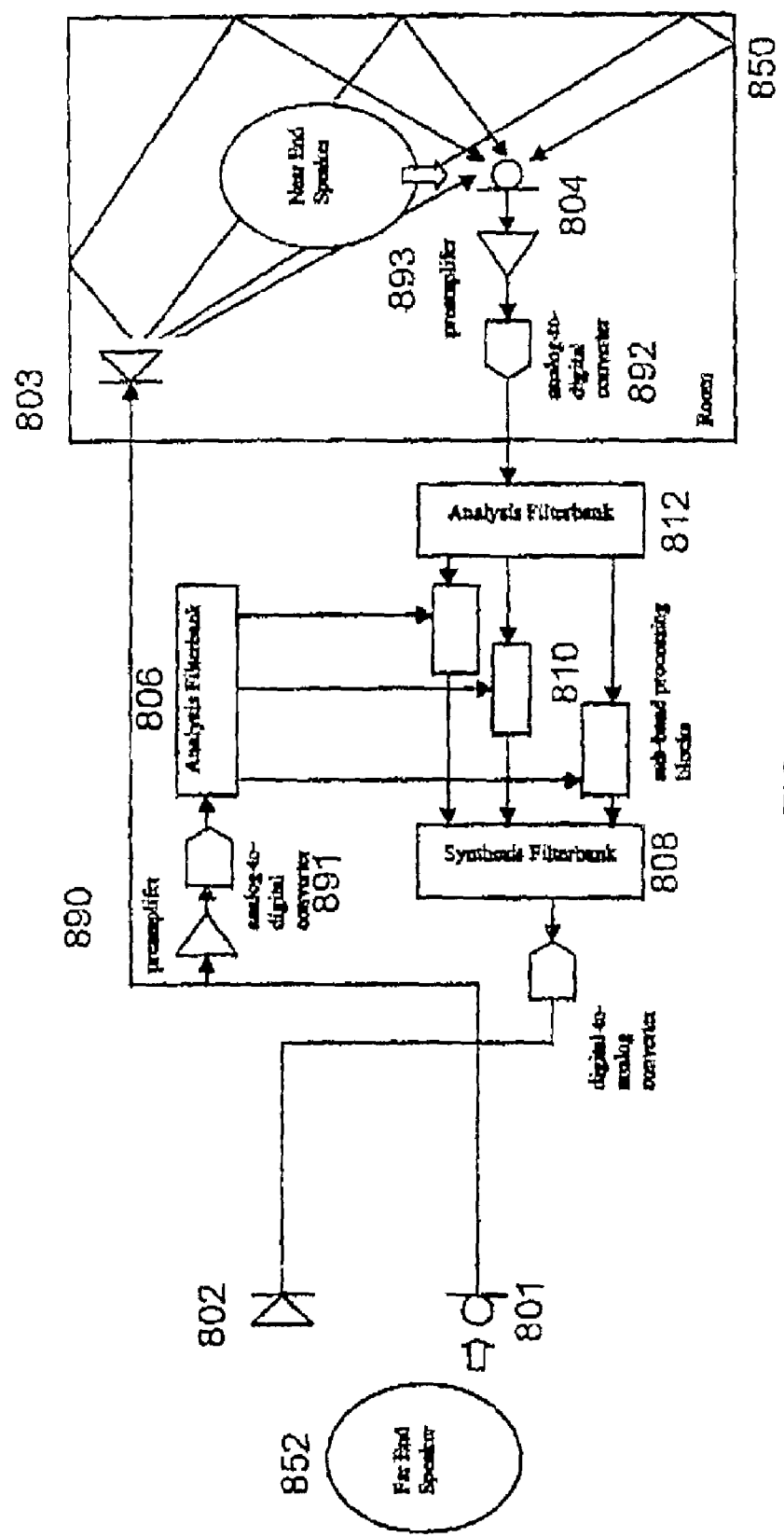
FIG. 8 shows a block diagram of a sub-band adaptive acoustic echo cancellation system with the oversampled WOLA filterbank.

A yet further preferred embodiment of the invention is use in an echo cancellation system. The goal of acoustic echo cancellation is to remove the far end speaker's voice from the signal that enters the near end microphone and eventually reaches the loudspeaker at the far end. This allows the near end speaker's voice to be transmitted without echoes of the far end speaker's voice (caused by room reverberation), for better intelligibility and less listening effort. An adaptive signal processing system must deal with a significantly long room response. A single time domain filter implementation would typically contain thousands of coefficients to adequately model this response, with consequently high processing power requirements. The use of the present invention to implement an LMS algorithm is used to control the adaptive filters, as illustrated in FIG. 8, allows for shorter filters and therefore a savings in processing power over the traditional time domain approach. A shown in FIG. 8, the far end speaker (person) makes use of a microphone 801 and receiver (loudspeaker) 802 which are connected to the near end speaker (person) who also has a receiver (loudspeaker) 803 and a microphone 804. Because of the typical acoustic properties of rooms in which such systems are used, some fraction of the sound emitted by the receiver 803 inevitably enters the microphone 804 at the near end. Of course the same is true if the far end uses a similar receiver and microphone system, but this discussion will be restricted to a simpler configuration where only one end is so arranged. In a generalised system, to mitigate the problems caused by this inadvertent signal path, a system comprising analysis filterbanks 806, 812 and a synthesis filterbank 808 with sub-band processing blocks 810 interposed is used. The behaviour of the sub-band processing blocks conforms substantially to the algorithm described above.

Figure 9:
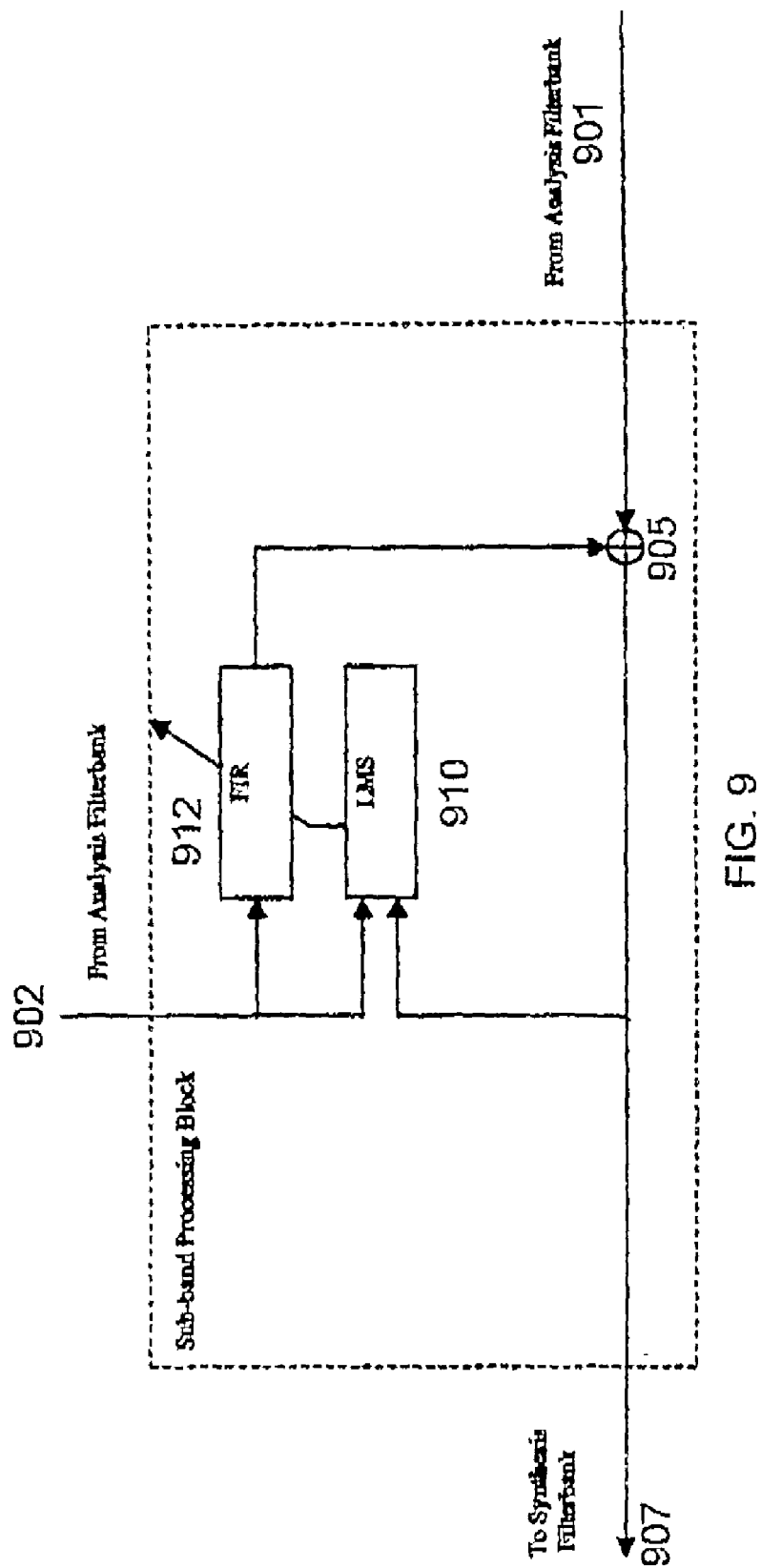
FIG. 9 shows a processing block for the sub-band adaptive acoustic echo cancellation system with the oversampled WOLA filterbank using LMS.

FIG. 9 shows in more detail a sub-band processing block 810 of FIG. 8. In each of these blocks, the input 901 passed from an analysis filterbank is summed with a signal derived from a farther input 902 passed from another analysis filterbank to provide an output 907 from which the unwanted signal is substanially removed. The processing of the input 902 is perfromted using an LMS filter 901, whose inputs are the modified output 907 and the input 902. The output of the LMS filter 901 is used to adjust and adapt the characteristics of a FIR filter 912 which processes the input 902 and passes the result to the summer 905. As may be expected, the configuration is much like the noise cancellation system described earlier, but in this case the far end speech is considered to be the unwanted noise, and the desired output signal is the near end speech.

The previously described embodiments are examples of adaptive sub-band adaptive signal processing with two inputs. It should be noted that they could be extended to make use of a multiplicity of inputs. A microphone array could be used to capture several input signals, all of which are summed to form the primary (i.e. signal plus noise) signal. Also, in some situations there are several noise sources to be cancelled, therefore a multiplicity of noise censors are required for the reference (i.e. noise) signals.

Time domain adaptive algorithms with more than two inputs signals are well known in the art. The benefits of sub-band adaptive signal processing over time domain adaptive signal processing still hold for these applications. See the co-pending application entitled "Sub-band Directional Audio Signal Processing Using an Oversampled Filterbank", which is filed on the same day by the present applicant.

Figure 10:
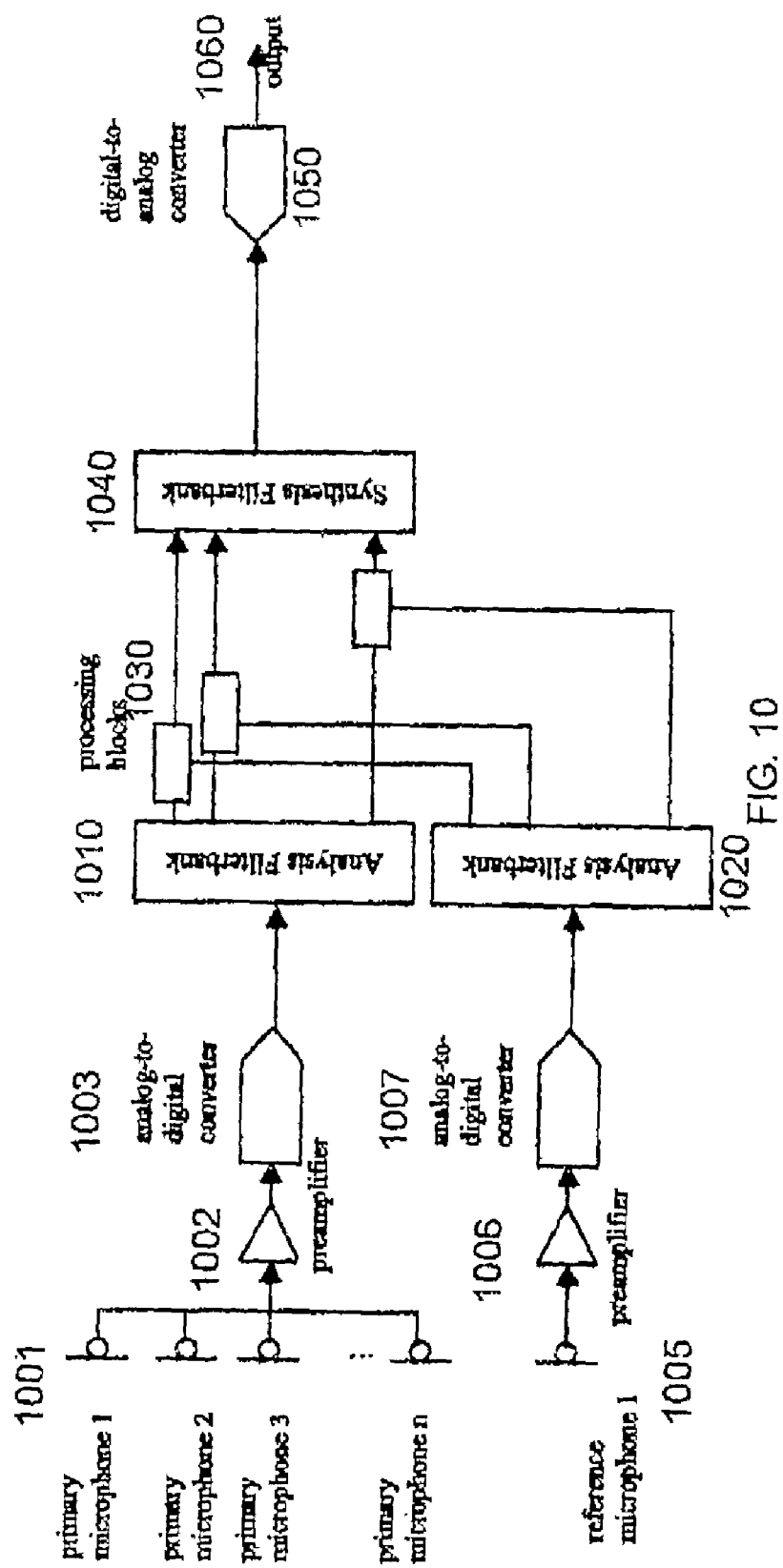
FIG 10 shows a block diagram of an oversampled WOLA filterbank processing system using a microphone array for the primary signal.

In a further embodiment of the invention a microphone array is used as the source of the primary signal composed of the signal-of-interest and noise, and a reference microphone collects the environment noise, substantially free of the signal-of-interest. In other respects the system is the same as in earlier embodiments. FIG. 10 illustrates the signal flow. An array of primary microphones 1001, which pickup the signal of interest with noise, are connected to a first preamplifier 1002 and associated first analog-to-digital converter 1003 which passes its output to a first analysis filterbank 1010. A reference microphone 1005, which picks up the noise, is connected to a second preamplifier 1006 and its associated second analog-to-digital converter 1007 which passes its output to a second analysis filterbank 1020. The sub-bands derived by the analysis filterbanks 1010, 1020 are passed to processing blocks 1030. The action of the processing blocks may be any of the previous noise cancelling or noise reduction strategies. The processing blocks 1030 then pass their outputs to the synthesis filterbank 1040 whose output is converted to analog by a digital-to-analog converter 1050 to produce the required output 1060.

A further embodiment of the invention uses multiple reference microphones, each with an analysis filterbank, together with processing making use of the LMS algorithm.

Figure 11:
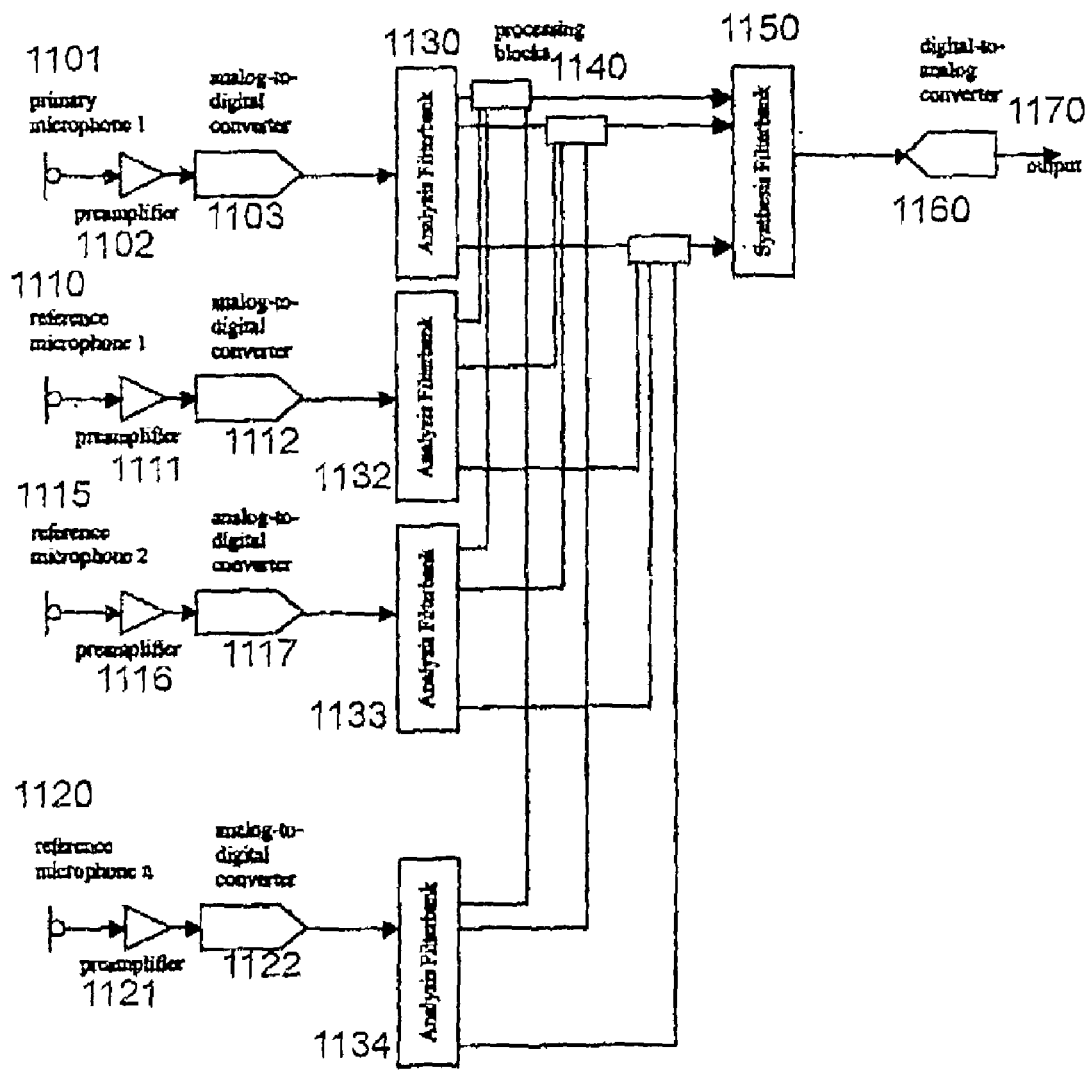
FIG. 11 shows a block diagram of a WOLA filterbank processing system with multiple reference inputs using LMS.
Figure 12:
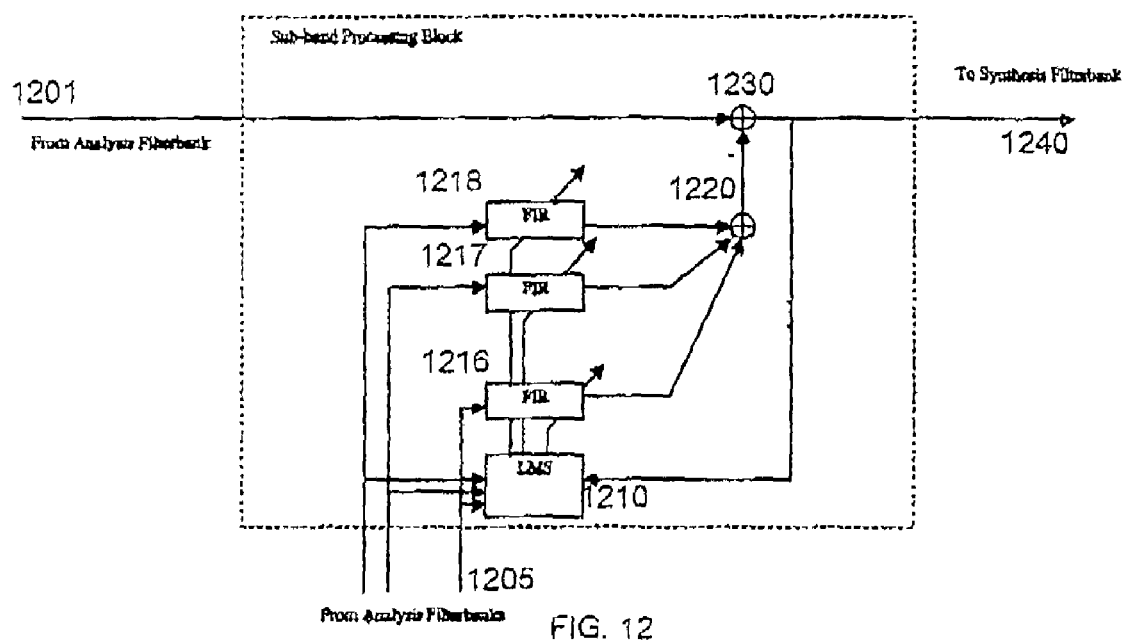
FIG. 12 shows a sub-band processing block for WOLA filterbank processing system with multiple reference inputs using LMS.

This type of configuration is used in a noise cancellation application when there are more than one noise source. One microphone is used for each noise source to provide a reference signal, which is adaptively filtered and then subtracted from the primary signal. FIG. 11 illustrates the signal flow and FIG. 12 shows the detail of each processing block in FIG. 11. Referring first to FIG. 11, a primary microphone 1101, arranged to pick up substantially the signal-of-interest, but which also picks up environmental noise from n discrete sources is connected to a first analysis filterbank 1130 through its associated preamplifier 1102 and analog-to-digital converter 1103. Note that, although in the figure and following description, three reference microphone 1110, 1115, 1120, arranged to pick up one of the three substantially independent noise sources are shown with their associated components, this number may be fewer or larger as required to cover the number of discrete noise sources identified. Each reference microphone 1110, 1115, 1120, is connected to an associated analysis filterbank 1132, 1133, 1134 respectively through their respective preamplifiers 1111, 1116, 1121 and analog-to-digital converters 1112, 1117, 1122. Each sub-band generated from the signal of interest (first) analysis filterbank is passed to one of a number of processing blocks 1140, which will be describe below, and the outputs of the processing blocks 1140 are combined by the synthesis filterbank 1150 whose output is passed to a digital to analog converter 1160 to produce the desired, substantially noise-free output 1170.

Turning now to FIG. 12, the processing blocks 1140 of FIG. 11 are described in more detail. Each processing block accepts one sub-band derived from the signal-of-interest filterbank 1201, and this is then mixed or summed by a first summer 1230 with the results of processing the noise signals and then output 1240 to the synthesis filterbank 1150 of FIG. 11. Processing of the noise signals proceeds as follows: each appropriate sub-band output 1205 from the analysis filterbanks 1132, 1133, 1134 of FIG. 11 is passed to the input of a FIR filter, 1216, 1217, 1218 respectively and to an LMS controller 1210 which also receives the output of the first summer 1230. The FIR filters 1216, 1217, 1218 are controlled by the outputs of the LMS controller 1210. The outputs of the FIR filters 1216, 1217, 1218 are summed in a second summer 1220, before the result is applied to the first summer 1230.

The system removes from the primary signal (or signal of interest) the component of the primary signal which is correlated to the reference signal (or noise).

Appendix B attached hereto includes some details of an example algorithm for use in the present invention.

While the present invention has been described with reference to specific embodiments, the description is illustrative of the invention and is not to be construed as limiting the invention. Various modifications may occur to those skilled in the art without departing from the true spirit and scope of the invention as defined by the appended claims.

Appendix A Summary from U.S. Pat. No. 6,236,731 "Filterbank Structure and Method for Filtering and Separating an Information Signal into Different Bands, Particularly for Audio Signal in Hearing Aids" by R. Brennan and T. Schneider In accordance with the first aspect of this earlier invention, there is provided an oversampled filterbank for filtering an information signal, the filterbank having a filterbank structure comprising a filter means defining a filter bandwidth, said filter means filtering said information signal and separating said information signal into a plurality of frequency band signals each representing one of a plurality of uniformly spaced frequency bands within said filter bandwidth, said frequency bands being stacked in one of an even and an odd manner and said frequency bands overlapping, such that the summation of the unmodified frequency hand responses of the plurality of said frequency bands sums to a function within a predetermined passband ripple over said filter bandwidth, wherein the filter means includes a selection input enabling at least one of the following to be selected:

(i) the number of frequency band signals,
(ii) the bandwidth of said frequency bands,
(iii) selection of stacking of said frequency bands in one of an even and an odd manner,
(iv) the degree of overlap between said frequency bands,
(v) an oversampling factor by which said frequency band signals are sampled above the theoretical minimum of critical sampling.

The filterbank can be configured to enable one or more of usual parameters of a digital filterbank to be adjustable, and these can include: the number of bands; the width of each band; whether the bands have abutting band edges, overlap or are spaced apart; coefficients for both analysis and synthesis windows; whether there is any relationship between the analysis and synthesis windows; even or a odd stacking of bands; and the degree of oversampling above the critical sampling rate.

Preferably, the selection input enables at least one of the number of frequency bands and selection of stacking of said frequency bands in one of an even and an odd manner to be selected, said number of frequency bands being equal to N, and the filter means comprises: (a) a first analysis filterbank means for separating said signal into the plurality of N separate frequency band signals; (b) processing means for receiving and processing each of said separate frequency band signals to provide N separate processed frequency band signals; and (c) a second synthesis filterbank means for receiving and recombining the N separate processed frequency band signals into a single output signal, wherein both of the first analysis filterbank, means and the second synthesis filterbank means are connected to the selection input, the processing means being coupled between the first analysis filterbank means and the second synthesis filterbank means.

In another aspect of the earlier invention, the filterbank comprises a dedicated application specific integrated circuit (ASIC), said ASIC including the first analysis and the second synthesis filterbanks, and a programmable digital signal processor for controlling the number of frequency bands and the bandwidth of each frequency band, said digital signal processor being provided with the selection input.

The filterbank may be adapted to receive a single real monaural information signal, wherein said transform means generates non-negative frequency band signals and negative frequency band signals, said negative frequency band signals being derivable from the non-negative frequency band signals, and said processing means processes only said non-negative frequency band signals. Alternatively is adapted to filter an audio signal comprising first and second real monaural information signals which are combined into a complex stereo signal and wherein said transform means generates N combined frequency band signals, and wherein said processing means includes: (a) channel separation means for separating the N combined frequency band signals into the N frequency band signals corresponding to said first information signal and the N frequency band signals corresponding to said second information signal, each of said N frequency band signals comprising non-negative and negative frequency band signals; (b) first independent channel processing means connected to the channel separation means for receiving and processing each of said separate frequency band signals of said first information signal to provide a first set of N separate processed frequency band signals; (c) second independent channel processing means connected to channel separation means for receiving and processing each of said separate frequency band signals of said second information signal to provide a second set of N separate processed frequency band signals; and (d) channel combination means connected to the first and second independent channel processing means for combining said first set of N processed separate frequency band signals and said second set of N processed separate frequency band signals.

In accordance with another aspect of the earlier invention, there is provided a method of processing an information signal to selectively modify different frequency bands, the method comprising the steps of: (1) defining a filter frequency bandwidth to be analyzed; (2) dividing the filter frequency bandwidth into a plurality of uniformly spaced bands, said frequency bands being stacked in an even or odd manner and said frequency bands abutting, overlapping, or being spaced apart from one another; (3) filtering the information signal to separate the signal into a plurality of frequency band signals, each representing one of said uniform filter bands; (4) processing the frequency band signals; (5) recombining the signals of the individual bands to form an output signal; and (6) providing an input for enabling at least one of the following to be selected: (i) the number of frequency band signals, (ii) the bandwidth of said frequency bands, (iii) whether said frequency bands are stacked in an even or odd manner, (iv) whether said frequency bands abut, overlap, or are spaced apart from one another, and (v) a decimation factor by which said frequency band signals are downsampled.

In another aspect the method of the earlier invention includes transforming the information signal into the frequency domain, providing N separate frequency band signals in the frequency domain, and effecting an inverse transform of the N separate processed frequency band signals into the output signal in the time domain Appendix B: Algorithm Description This is a brief description of a sample algorithm for use with the present invention.

An input signal x contains the desired speech and some additive noise. A second input signal y contains just the additive noise. Each signal will be filtered in slightly different ways before reaching the adaptive filtering due to spatial and physical differences in the transducers and equipment used to capture them. Ideally, if this filtering did not occur then one could simply subtract y from x to recover the speech signal. Because of the unknown filtering, a new filter W must somehow be determined to transform y such that it marches the noise in x. Applying this filter to y and then performing the subtraction will yield a clean speech signal.

A WOLA filterbank provides the frequency domain representation of the signals necessary to compute the sub-band adaptive filter. The WOLA produces N=2 complex frequency domain results for each signal from N point Fast Fourier Transforms FFTs of the incoming signal frames. The goal of the algorithm is to perform a least-squares fit of the WOLA output for both signals on a sub-band-by-sub-band basis. That is, the fit is computed independently for each band of the filterbank. Put mathematically, the least-squares fit ($\hat{X}_k$) attempts to determine the complex filter weight $W_k$ in the kth band that fits the data to the following equation:

$$\hat{X}_k = W_k Y_k \tag{1}$$

In order to determine $W_k$ in each band, a model for computing a least-squares estimator is required. Using equation 1, the model is straightforward, taking the form of equation 2 where $\epsilon_{ki}$ is the residual error for the ith frame in the kth band while $X_{ki}$ and $Y_{ki}$ are the WOLA outputs of the filterbank in band k for the ith frame.

$$\epsilon_{ki} = X_{ki} - \hat{X}_{ki} \tag{2}$$

For n frames, the sum of the squared error will be:

$$\sum_{i=1}^{n} \epsilon_{ki} \epsilon_{ki}^* = \sum_{i=1}^{n} (X_{ki} - W_{ki})(X_{ki} - W_{ki})^* \tag{3}$$

Note that we actually use complex conjugation (*), because the filterbank outputs are all complex values, and therefore two-dimensional vectors. The least squares solution requires that we minimize the magnitude of the error vector squared. To find an estimator for $W_k$, the derivative of equation 3 with respect to $W_k$ is set to 0 and solved for $\hat{W}_k$, the estimator in a particular band. The result of this produces the estimator described by equation 4.

$$\hat{W}_k = \frac{\sum_{i=1}^{n} X_{ki} Y^*_{ki}}{\sum_{i=1}^{n} |Y_{ki}|^2} \tag{4}$$

Not surprisingly, equation 4 is an n sample elicitation of the cross-power spectral density over the auto-power spectral density within a particular band, matching directly to the classic optimal Wiener filter. Since the output of the filterbank at each band is the output of a bandpass filter, this spectral estimation is essentially a periodogram-based estimate. Because the WOLA filterbank results are all complex values, the resulting filter weight $\hat{W}_k$ is a complex value that should compensate for both magnitude and phase differences between the correlated noise portions of each channel. The resulting filter which is composed of the N=2 estimators (one per band), is then simply applied to the secondary channel results, Y, and subsequently subtracted from X to produce a cleaned signal.

Computing the extended summations and complex division required by equation 4 is not feasible for real-time. Therefore, some alternative method of computing the estimator over a reasonable timeframe is required. The adaptive filter described below does this by smoothing and averaging the instantaneous outputs from the filterbank in every frame. Also, there is the problem of dealing with the error in the adaptive filter. Even the ideal result from equation 4 is merely an estimate, and reducing its accuracy due to computational constraints would theoretically reduce its performance. In the best case, the result of these errors in the filter will be simply reduced noise suppression. In the worst case, they will cause distortion and artifacts in the output signal. In order to reduce this effect, the algorithm does not subtract the entire result of the filtering. Rather, it subtracts an attenuated version of the adaptive filter output. This produces fewer speech artifacts at the cost of lower noise suppression.

Using only the instantaneous output of the filterbank analysis reduces the calculation for $\hat{W}_k$ to a single complex division with no summations required as shown in equation 5. This is exactly equivalent to using equation 4 with n=1.

$$\hat{W}_k = \frac{X_k Y^*}{X_k Y^*} = \frac{X_k}{Y_k} \tag{5}$$

This estimate is then smoothed across frames using an exponential average with parameter $\alpha$ such that the filter weight for the kth band in the nth frame is:

$$\hat{W}_k(n) = \alpha \left(\frac{X_k(n)}{Y_k(n)}\right) + (1-\alpha)\hat{W}_k(n-1) \tag{6}$$

This first order difference equation acts as a low-pass filter, smoothing out frame-by-frame variations in the spectra which would cause the values of the filter weights to change quickly. This form of low-pass filter is extremely advantageous because it is very simple, and in particular requires only one multiplication operation. This is useful for a future real-time implementation. The preliminary results from using this strategy were successful in removing various kinds of artificial noise (white, pink, high/low-pass), and the decision was made to not extend the estimator for $\hat{W}_k$ beyond a single frame in the initial design. The value of $\alpha$ directly effects the rate at which the algorithm develops a "good" solution for each $W_k$ by smoothing out all variations which deviate the estimator from it's optimal value, Smaller values of $\alpha$ cause the algorithm to converge to a solution at a slower rate, however values of $\alpha$ which are too large allow the filter weights to change with large jumps and creates significant artifacts which seriously hamper the quality of the noise reduced signal. It is possible to modify the adaptive filter so that it uses a small number of past frames to calculate $\hat{W}_k$ in each sub-band, within the limits of computational cycles of the technology.

The attenuated noise subtraction is subtracted on a band-by-band basis:

$$\epsilon_k = X_k - \beta_k \hat{W}_k Y_k \tag{7}$$

Where $\beta_k$ is a decimal between 0 and 1 indicating the portion of the filtered noise in the secondary channel to subtract from the primary channel. The intended usage of the entire vector, $\beta$, is to weight the noise subtraction such that audible speech artifacts are minimized. This technique has been successfully used in single-microphone noise reduction techniques. This means using less noise suppression in sub-bands with large amounts of speech where the effect of the algorithm would produce the most distortion. Since in a real-time implementation, the frequency spectrum of the speech signal is unknown, a heuristic is necessary to determine a suitable β in advance. Based on the reasoning that the majority of human speech is confined to below 4 kHz, the decision was made to subtract all noise in bands higher than 4 kHz. Various attenuations in bands below 4 KHz can be chosen depending on the application and on the perception of the user.

The SNR improvements of the sub-band Wiener filtering algorithm presented here, the versatility in different noise environments and low computational cost of the algorithm make it an ideal candidate for bringing true digital signal processing into the headset market.

What is claimed is:

1. An adaptive signal processing system for improving a quality of a signal, comprising:
    a first weighted-overlap-add (WOLA) analysis filterbank for receiving a primary information signal in the time domain and for implementing block processing including a weighting window limited in length to transform the primary information signal into a plurality of oversampled sub-band primary complex signals in the frequency domain;
    a second WOLA analysis filterbank for receiving a reference signal in the time domain and for implementing block processing including a weighting window limited in length to transform the reference signal into a plurality of oversampled sub-band reference complex signals numerically equal to the number of primary signal sub-bands;
    a plurality of sub-band processing circuits for processing the oversampled sub-band complex signals to improve a quality of an output signal, each including a complex adaptive filter for performing adaptive filtering and a feedback circuit, each complex adaptive filter having adjustable parameters, each feedback circuit including an adaptation circuit for adjusting the adjustable parameters based on the result of the processing and an emphasis filter for improving convergence of the adaptation circuit; and
    a WOLA synthesis filterbank for combining the outputs of the sub-band processing circuits to generate the output signal in the time domain.

2. The adaptive signal processing system of claim 1 wherein each complex adaptive filter is a digital filter having the adjustable parameters, each feedback circuit adjusting the adjustable parameters of the digital filter based on the result of the processing.

3. The adaptive signal processing system of claim 2 wherein the filter is a FIR filter for filtering the sub-band reference signal, and the feedback circuit includes a summer for summing the output of the FIR and the sub-band primary signal, and wherein the adaptation circuit includes module for adjusting, in response to the output of the summer and the sub-hand reference signal, the adjustable parameters of the FIR filter.

4. The adaptive signal processing system of claim 1 wherein the adaptation circuit includes a LMS circuit, and the emphasis filter is provided for improving convergence of the LMS circuit.

5. The adaptive signal processing system of claim 1 further comprising a Voice Activity Detector (VAD) for accepting frequency domain and time domain inputs, and controlling the sub-band processing circuit.

6. The adaptive signal processing system of claim 2 further comprising a Voice Activity Detector (VAD) for accepting frequency domain and time domain inputs, and controlling the sub-band processing circuit.

7. The adaptive signal processing system of claim 3 further comprising a Voice Activity Detector (VAD) for accepting frequency domain and time domain inputs, and controlling the sub-band processing circuit.

8. The adaptive signal processing system of claim 4 further comprising a Voice Activity Detector WAD) for accepting frequency domain and time domain inputs, and controlling the sub-band processing circuit.

9. An adaptive signal processing system for improving a quality of a signal, comprising:
    a first analysis filterbank for receiving a primary information signal in the time domain and transforming the primary information signal into a plurality of oversampled sub-band primary signals in the frequency domain;
    a second analysis filterbank for receiving a reference signal in the time domain and transforming the reference signal into a plurality of oversampled sub-band reference signals numerically equal to the number of primary signal sub-bands;
    a plurality of sub-band processing circuits for processing these signals to improve a quality of an output signal; and
    a synthesis filterbank for combining the outputs of the sub-band processing circuits to generate the output signal,
    wherein the sub-band processing circuit minimizes some error metric, which includes The value of the squared error $E^2$ as described in the following equation:

$$E^2 = (YW-X)(YW-X)^*$$

wherein the "Y" denotes the sub-band primary signals, the "X" denotes the sub-band reference signals, the "W" denotes an adaptive weighting filter, the "E" denotes a summation of the "X" and "Y" filtered by the "W", and the "*" operator denotes complex conjugation.

10. The adaptive signal processing system of claim 1 wherein the primary information signal includes an audio signal and a first noise and the reference signal includes a second noise, and the first noise is correlated to the second noise.

11. The adaptive signal processing system of claim 5, wherein the VAD operates on the primary information signal, the reference signal or a combination thereof, and the oversampled sub-band primary complex signals, the oversampled sub-band reference complex signals or a combination thereof.

12. The adaptive signal processing system of claim 1, wherein each of the WOLA analysis filterbanks provides an input to each sub-band processing circuit, which is isolated in frequency.

13. The adaptive signal processing system of claim 1, wherein the sub-band processing circuit performs a least mean square (LMS) algorithm, a recursive least square algorithm, or a combination thereof.

14. The adaptive signal processing system of claim 1, wherein one of the primary information signal and the reference signal is noise, and the other includes a signal of interest with the noise.

15. The adaptive signal processing system of claim 1, wherein the sub-band processing circuits include an emphasis filter for whitening the input of the sub-band processing circuits.

16. The adaptive signal processing system of claim 2, wherein the filter includes a Wiener filter for filtering the oversampled sub-band reference complex signal, and the feedback circuit Includes a summer for summing the output of the Wiener filter and the oversampled sub-band primary complex signal, and wherein the adaptation circuit includes a LMS circuit for controlling the Wiener filter in response to the output of the summer and the oversampled sub-band primary complex signal.

17. A method of improving a quality of a signal, comprising the steps of:
- at a first weighted-overlap-add (WOLA) analysis filterbank, implementing block processing including a weighting window limited in length to transform a primary information signal in the time domain into a plurality of oversampled sub-band primary complex signals in the frequency domain;
- at a second WOLA analysis filterbank, implementing block processing including a weighting window limited in length to transform a reference signal in the time domain into a plurality of oversampled sub-band reference complex signals numerically equal to the number of primary signal sub-bands;
- at each of sub-band processing circuits, adaptively processing the over-sampled sub-band complex signals, including performing adaptive filtering at a complex adaptive filter which has adjustable parameters, the processing step including, at a feedback circuit included in the sub-band processing circuit, implementing adaptive algorithm to adjust the adjustable parameters based on the result of the processing, and improving convergence of the adaptation algorithm; and
- at a WOLA synthesis filterbank, combining the outputs of the sub-band processing circuits to generate an output signal having a signal of interest of improved quality and in the time domain.

18. A method of claim 17, wherein at each of the sub-band processing circuits, the processing step includes the step of adjusting the coefficients of the complex adaptive filter based on the over-sampled sub-band primary complex signal and the over-sampled sub-band reference complex signal.

19. The adaptive signal processing system of claim 1, wherein the complex adaptive filter Includes a first adaptive filter for the over-sampled sub-band primary and reference complex signals and a second adaptive filter for the over-sampled sub-band reference complex signals, the emphasis filter and the adaptation circuit being allocated only to the first adaptive filter.

20. The adaptive signal processing system of claim 9, wherein each of the first and second analysis filterbanks is a WOLA analysis filter-bank.

* * * * *